United States Patent [19]
Nakae

[11] Patent Number: 5,888,677
[45] Date of Patent: Mar. 30, 1999

[54] EXPOSURE MASK, METHOD OF FABRICATING SAME, AND METHOD OF MANUFACTURING SEMICONDUCTOR DEVICE

[75] Inventor: Akihiro Nakae, Tokyo, Japan

[73] Assignee: Mitsubishi Denki Kabushiki Kaisha, Tokyo, Japan

[21] Appl. No.: 882,999

[22] Filed: Jun. 26, 1997

[30]    Foreign Application Priority Data

Dec. 20, 1996   [JP]   Japan ..................................... 8-341367

[51] Int. Cl.$^6$ ....................................................... G03F 9/00
[52] U.S. Cl. ................................................................ 430/5
[58] Field of Search ............................... 430/5, 322, 324, 430/321, 311

[56]              References Cited

U.S. PATENT DOCUMENTS 5,342,713   8/1994   Ohtsuka et al. ............................. 430/5
5,429,897   7/1995   Yoshioka et al. ............................ 430/5

FOREIGN PATENT DOCUMENTS 62-50811   10/1987   Japan .
6-275492    9/1994   Japan .
7-253649   10/1995   Japan .

*Primary Examiner*—S. Rosasco
*Attorney, Agent, or Firm*—Oblon, Spivak, McClelland, Maier & Neustadt, P.C.

[57]              ABSTRACT

An exposure mask has a predetermined principal pattern formed on a principal surface of a mask substrate and including a continuous pattern of lines which are repeatedly arranged at a first interval and an isolated pattern which is arranged adjacent to a line of the continuous pattern at a second interval greater than the first interval; and an auxiliary pattern formed along a direction in which the predetermined principal pattern is arranged, adapted to overcome multiple-beam-flux interference of diffracted light on a pupil's plane by providing the isolated pattern with cyclicity, and having a line width which falls outside a limit of resolution on a plane of projection of exposing light. Also disclosed are a method of fabricating the mask, and a method of manufacturing semiconductor devices using the mask.

8 Claims, 14 Drawing Sheets

—— NO GRID PATTERN
----- GRID PATTERN

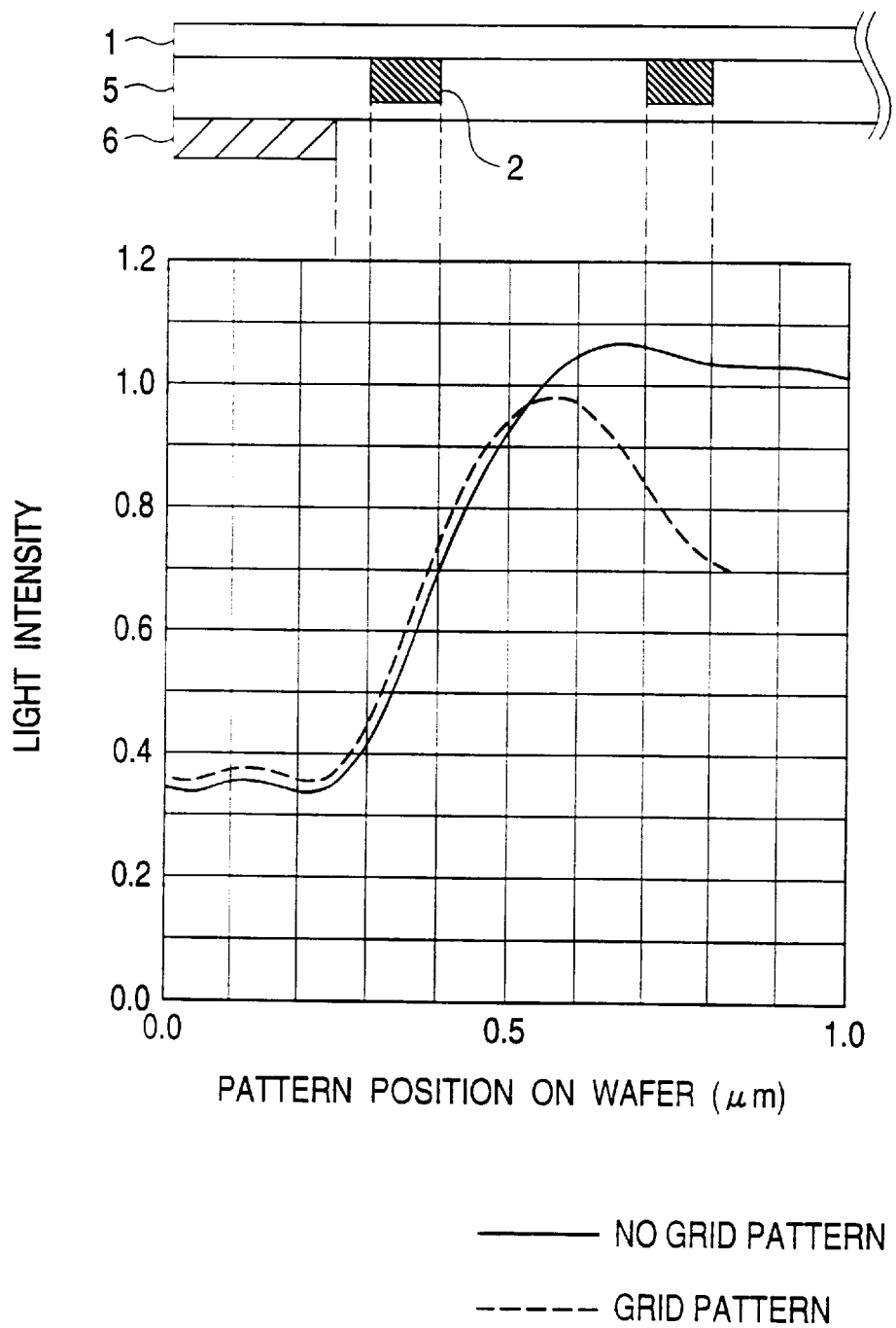

BEST FOCUS PLANE

○ BRIGHT
△
□
▲
● DARK

BEST FOCUS PLANE

EXPOSURE MASK, METHOD OF FABRICATING SAME, AND METHOD OF MANUFACTURING SEMICONDUCTOR DEVICE

BACKGROUND OF THE INVENTION

1. Field of Invention

The present invention relates to an exposure mask used in lithography in the process of manufacturing semiconductor devices, a method of fabricating the mask, and a method of manufacturing semiconductor devices.

2. Discussion of the Background

Various super-resolution techniques are being utilized in the lithography technology, since exposures based on circular illumination using conventional circular light sources are unable to obtain sufficient depths of focus. As such super-resolution techniques, a deformed illumination method and a Levenson phase shift method (Japanese Patent Application Publication No. 50811/1987) have been proposed.

In the deformed illumination method, the angle of incidence of illuminating light is selected such that only 0th-order diffracted light and one of ±1st-order diffracted lights from a pattern enters a projection optical system, and that 0th-order light and one of ±1st-order lights generally pass a target position in a pupil's plane. This method makes it possible to increase the depth of focus and increase the resolution.

However, although these techniques substantially improve the resolution and increase the depth of focus with respect to cyclic patterns such as line-and-space patterns, there is a restriction in the pattern layout in that these techniques are not effective with respect to isolated patterns. The reason for this is that although, in the deformed illumination method and the Levenson phase shift method, a state of two-beam-flux interference is produced by making use of diffracted light generated due to the cycle of the pattern so as to increase the depth of focus, it is difficult to produce the state of two-beam-flux interference with respect to isolated patterns since the cycle of the pattern is large.

FIGS. 12A and 12B are schematic diagrams for explaining the theory of diffraction in the reduction exposure technology. FIG. 12A is a schematic diagram in a case where a mask having a small pattern pitch is used, and FIG. 12B is a schematic diagram in a case where a mask having a large pattern pitch is used.

In FIG. 12A, reference numeral 57 denotes light for exposure which is emitted from a light source (not shown) of a stepper; 58, a mask with a small pattern pitch and having light-shielding portions 63 and transparent portions 64; 59, a lens on which the light transmitted through the mask is made incident after being separated; 60, the pupil's plane of the lens; and 62, a wafer surface which constitutes the plane of projection.

Referring to FIG. 12A, the light 57 which has been transmitted through the mask 58 having the small pattern pitch is separated into 0th-order diffracted light 52 which advances straightly along the optical axis, ±1st-order diffracted light 53 having an angle of θ ($\sin\theta = \lambda/P$; $\lambda$, wavelength of exposing light; P, pattern pitch) with respect to the optical axis, and −1st-order diffracted light 54, is made incident upon the pupil's plane 60 of the lens 59, and forms an image on the wafer surface, thereby forming an image of the pattern of the mask 58.

Meanwhile, FIG. 12B shows a case where the light 57 is made incident upon a mask 61 with a large pattern pitch and having the light-shielding portions 63 and the transparent portions 64. In FIG. 12B, the light 57 which has been transmitted through the mask 61 having the large pattern pitch is separated into the 0th-order diffracted light 52 which advances straightly along the optical axis, the ±1st-order diffracted light 53 having the angle of θ with respect to the optical axis, the −1st-order diffracted light 54, +2nd-order diffracted light 55, −2nd-order diffracted light 51, +3rd-order diffracted light 56, −3rd-order diffracted light 50, is made incident upon the pupil's plane 60 of the lens 59, and forms an image on the wafer surface, thereby forming an image of the pattern of the mask 61.

In FIGS. 12A and 12B, only the diffracted light which has been transmitted through the inner side of the pupil's plane 60 of the lens 59 contributes to the formation of an image on the wafer surface 62. For this reason, in FIG. 12B, since the pattern pitch of the mask is large, the angle θ with respect to the optical axis becomes small, with the result that the ±1st-order diffracted light, the ±2nd-order diffracted light, the ±3rd-order diffracted light, . . . are made incident upon the inner side of the pupil's plane 60 of the lens 59, thereby causing multiple-beam-flux interference to occur.

FIGS. 13A and 13B are schematic diagrams illustrating the states of diffracted light formed in the pupil's plane of a projection lens system in cases where the masks shown in FIGS. 12A and 12B are used. FIG. 13A shows the diffracted light in the pupil's plane after being transmitted through the mask 58 having the small pattern pitch, and FIG. 13B shows the diffracted light in the pupil's plane after being transmitted through the mask 61 having the large pattern pitch.

In FIGS. 13A and 13B, reference numeral 60 denotes the pupil's plane of the lens; 52, the 0th-order diffracted light; 53, the +1st-order diffracted light; 54, the ±1st-order diffracted light; 55, the +2nd-order diffracted light; 51, the −2nd-order diffracted light; 56, the +3rd-order diffracted light; and 50, the −3rd-order diffracted light.

In FIG. 13B, since the pitch of the pattern formed on the mask is large, the angle θ of incidence upon the pupil's plane is small, and the interval of the diffracted light becomes small, so that even higher-order diffracted light enters the pupil's plane 60. Consequently, multiple-beam-flux interference occurs in the case of an isolated pattern with the large pattern pitch, and the depth of focus decreases as compared with the continuous pattern with the small pitch shown in FIG. 13A.

Here, referring to FIGS. 14A and 14B, a description will be given of the cause of the decrease in the depth of focus due to the occurrence of the multiple-beam-flux interference. FIGS. 14A and 14B are schematic diagrams for explaining image formation due to various types of interference. FIG. 14A shows image formation due to the multiple-beam-flux interference by taking three-beam-flux interference as an example, and FIG. 14B shows image formation due to two-beam-flux interference.

In the three-beam-flux interference shown in FIG. 14A, since the phase of ±1st-order light with 0th-order light as a reference changes with defocusing, the contrast of the image declines. This is more noticeable with multiple-beam-flux interference of three beam fluxes or more. Meanwhile, in the two-beam-flux interference shown in FIG. 14B, troughs (mutually weakening portions) of two waves and ridges (mutually strengthening portions) thereof occur at the same positions, respectively, the phase difference between them does not occur even during defocusing, so that the contrast of the image does not decline.

Thus, in the multiple-beam-flux interference, the phase relationship changes when the plane of projection is offset
} from the plane of the best focus in the defocusing direction, making it impossible to maintain the contrast of the image. Therefore, there occurs the problem that the depth of focus decreases.

As a method for overcoming this problem, Unexamined Japanese Patent Publication No. 6-275492, for instance, proposes a method for increasing the depth of focus of an isolated pattern in a case where a continuous pattern and an isolated pattern are present on the same mask in a mixed form.

Here, a description will be given of the method disclosed in Unexamined Japanese Patent No. 6-275492 for increasing the depth of focus of an isolated pattern in the case where a continuous pattern and an isolated pattern are present on the same mask in a mixed form.

FIGS. 15A to 15C are plan views of mask patterns illustrating the conventional method for increasing the depth of focus of isolated patterns.

First, FIG. 15A is a plan view illustrating a line-and-space pattern. FIG. 15B is a plan view illustrating an isolated pattern 69 and an auxiliary pattern 70 which are delineated on the same mask as that of FIG. 15A. FIG. 15C is a plan view illustrating an inverted pattern of the auxiliary pattern shown in FIG. 15B.

In FIGS. 15A and 15B, a line-and-space pattern 68 as well as the isolated pattern 69 and its auxiliary pattern 70 are formed on a mask 67. In FIG. 15C, an inverted pattern 72 with Cr removed for inverting the auxiliary pattern 70 is formed on a mask 71 which is a layer separate from the mask 67.

First, by using the mask 67, reduction projection exposure is effected by oblique incidence illumination from a four-split light source, and the line-and-space pattern 68, the isolated pattern 69, and the auxiliary pattern 70 are transferred onto a posi-type photoresist on a wafer. Subsequently, by using the mask 71, reduction projection exposure is effected in a similar manner, thereby causing the transferred pattern of the auxiliary pattern 70 formed on both sides of the isolated pattern 69 to disappear.

With the conventional method, however, the auxiliary patterns provided on both sides of the isolated pattern for increasing the depth of focus of the isolated pattern are resolved on the wafer. For this reason, the mask for causing the auxiliary pattern to disappear by the use of the inverted pattern is required, and a step for causing the auxiliary pattern to disappear by using the mask is required, with the result that the number of fabrication steps increases. In addition, there is a problem in that in a case where an alignment error has occurred during pattern exposure, the function of causing the auxiliary pattern to disappear degrades.

SUMMARY OF THE INVENTION

The present invention has been devised to overcome the above-described problems, and it is an object of the present invention to provide an exposure mask which is capable of increasing the depth of focus of an isolated pattern without an increase in the number of fabrication steps by using a separate-layer mask.

Another object of the present invention is to provide a method of manufacturing semiconductor devices which makes it possible to form a satisfactory pattern without causing a blurring of an image due to exposure or a decline in the resolution even if exposure is effected with respect to an actual wafer surface by using a mask in which a continuous pattern and an isolated patter having a small depth of focus are present in a mixed form.

To these ends, in accordance with a first aspect of the present invention, there is provided an exposure mask comprising: a mask substrate; a predetermined principal pattern formed on a principal surface of the mask substrate and including a continuous pattern of lines which are repeatedly arranged at a first interval and an isolated pattern which is arranged adjacent to a line of the continuous pattern at a second interval greater than the first interval; and an auxiliary pattern formed along a direction in which the predetermined principal pattern is arranged, adapted to overcome multiple-beam-flux interference of diffracted light on a pupil's plane by providing the isolated pattern with cyclicity, and having a line width which falls outside a limit of resolution on a plane of projection of exposing light.

In accordance with the above-described first aspect of the invention, the auxiliary pattern having a line width which falls outside a limit of resolution on the plane of projection of the exposing light is formed on the same mask as the one having a continuous pattern and an isolated pattern, and the isolated pattern is provided with a cycle of a small pitch. Accordingly, the depth of focus of the isolated pattern can be increased, thereby making it possible to eliminate the step of causing the auxiliary pattern to disappear by the use of a separate-layer mask.

In accordance with a second aspect of the present invention, in the exposure mask according to the first aspect of the invention, the auxiliary pattern is a grid-shaped pattern.

In accordance with the above-described second aspect of the invention, since a grid pattern is used as the auxiliary pattern, this grid pattern can be used for both the isolated pattern oriented in the X-direction and the isolated pattern oriented in the Y-direction.

In accordance with a third aspect of the present invention, in the exposure mask according to the first aspect of the invention, the auxiliary pattern is formed of a halftone-type material.

In accordance with the above-described third aspect of the invention, since the auxiliary pattern is formed of a halftone-type material, it is possible to broaden the line width of the auxiliary pattern, so that the fabrication of the auxiliary pattern is facilitated.

In accordance with a fourth aspect of the present invention, there is provided a method of fabricating an exposure mask, comprising the steps of: forming on a mask substrate an auxiliary pattern having a line width which falls outside a limit of resolution on a plane of projection of exposing light; forming an insulating film on the auxiliary pattern; and forming a predetermined principal pattern in which a continuous pattern of lines which are repeatedly arranged at a first interval and an isolated pattern which is arranged adjacent to a line of the continuous pattern at a second interval greater than the first interval are arrayed on the insulating film, wherein the auxiliary pattern formed in the step of forming the auxiliary pattern overcomes multiple-beam-flux interference of diffracted light on a pupil's plane by providing the isolated pattern formed in the step of forming the predetermined principal pattern with cyclicity.

In accordance with the above-described fourth aspect of the invention, since the auxiliary pattern is formed prior to the formation of the predetermined principal pattern having a continuous pattern and an isolated pattern, the fabrication of the mask can be effected simply without needing to pay heed to the position of the auxiliary pattern corresponding to an isolated pattern portion of the predetermined principal pattern.

In accordance with a fifth aspect of the present invention, there is provided a method of manufacturing a semiconductor device, comprising the step of: effecting reduction projection exposure by using a mask comprising: a predetermined principal pattern formed on a mask substrate and including a continuous pattern of lines which are repeatedly arranged at a first interval and an isolated pattern which is arranged adjacent to a line of the continuous pattern at a second interval greater than the first interval; and an auxiliary pattern formed along a direction in which the predetermined principal pattern is arranged, adapted to overcome multiple-beam-flux interference of diffracted light on a pupil's plane by providing the isolated pattern with cyclicity, and having a line width which falls outside a limit of resolution on a plane of projection of exposing light.

In accordance with the above-described fifth aspect of the invention, since the depth of focus of the isolated pattern can be increased by the use of the auxiliary pattern having a line width which falls outside a limit of resolution on the plane of projection of the exposing light, the depth of focus of the patterns of the entire mask including the continuous pattern can be increased. Hence, it is possible to form satisfactory patterns without causing a blurring of the image due to exposure or a decline in the resolution even if exposure is effected with respect to the actual plane of projection where a warping or surface irregularities are present. Therefore, it is possible to obtain highly integrated semiconductor devices excelling in electric characteristics.

Furthermore, since the auxiliary pattern has a line width which falls outside the limit of resolution on the plane of projection of the exposing light, a mask for removing the auxiliary pattern and a step for fabricating the mask are not required. Thus there is an advantage in that the process of manufacturing semiconductor devices can be simplified.

BRIEF DESCRIPTION OF THE DRAWINGS

FIGS. 5A and 5B are schematic diagrams for explaining an optical image of the predetermined principal pattern which is formed in the pupil's plane of a projection lens system in accordance with the first embodiment of the present invention, in which FIG. 5A illustrates a continuous pattern and FIG. 5B illustrates an isolated pattern;

FIG. 9 is a graph illustrating optical-image evaluation of the masks in a case where a grid pattern having a different focus was provided and a case where it was not in accordance with the first embodiment of the present invention

FIGS. 12A and 12B are schematic diagrams for explaining the theory of diffraction in the reduction exposure technology in accordance with the conventional art, in which FIG. 12A illustrates a case where a mask having a small pattern pitch is used, and FIG. 12B illustrates a case where a mask having a large pattern pitch is used;

FIGS. 13A and 13B are schematic diagrams illustrating the states of diffracted light formed in the pupil's plane in accordance with the conventional art, in which FIG. 13A shows diffracted light in the pupil's plane after being transmitted through a mask having a small pattern pitch, and FIG. 13B shows diffracted light in the pupil's plane after being transmitted through a mask having a large pattern pitch;

FIGS. 14A and 14B are schematic diagrams for explaining image formation due to various types of interference in accordance with the conventional art, in which FIG. 14A shows image formation due to three-beam-flux interference, and FIG. 14B shows image formation due to two-beam-flux interference; and FIGS. 15A to 15C are plan views of mask patterns in accordance with the conventional art, in which FIG. 15A illustrates a line-and-space pattern, FIG. 15B illustrates an isolated pattern and an auxiliary pattern which are delineated on the same mask as that of FIG. 15A, and FIG. 15C illustrates an inverted pattern of the auxiliary pattern shown in FIG. 15B.

DESCRIPTION OF THE PREFERRED EMBODIMENTS

Referring now to FIGS. 1 to 11, a description will be given of the embodiments of the present invention. The dimensions given in FIGS. 1 to 11 are wafer-equivalent values which are dimensions on a wafer.

First Embodiment

Figure 1:
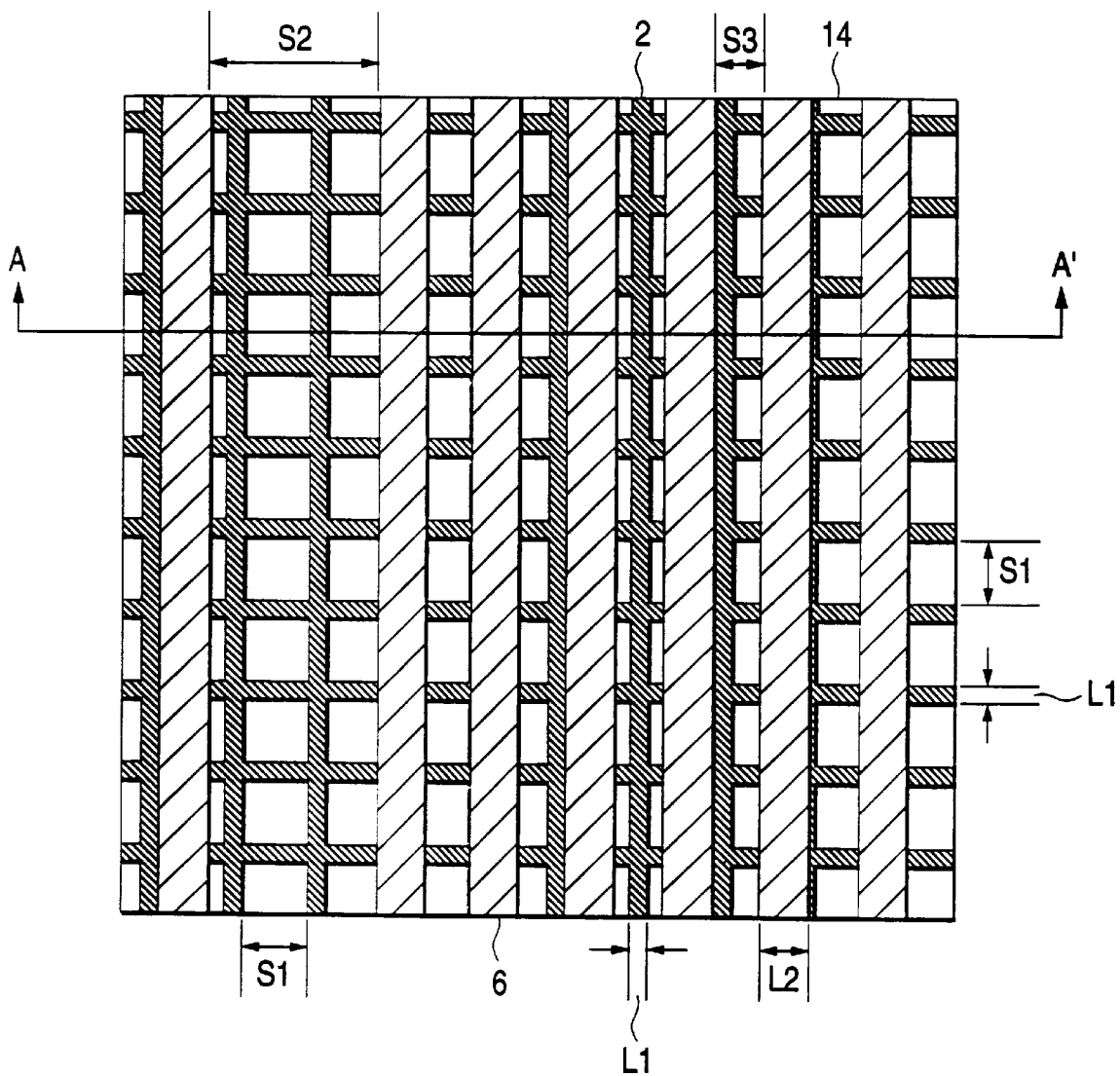
FIG. 1 is a plan view of a mask in accordance with a first embodiment of the present invention.
Figure 2:
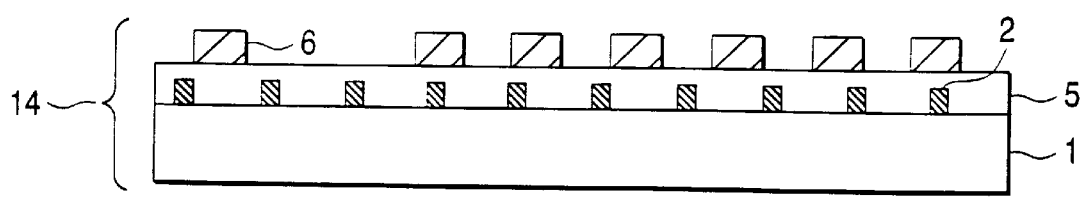
FIG. 2 is a cross-sectional structural view taken along line A–A' in the plan view of the mask shown in FIG. 1.
Figure 3:
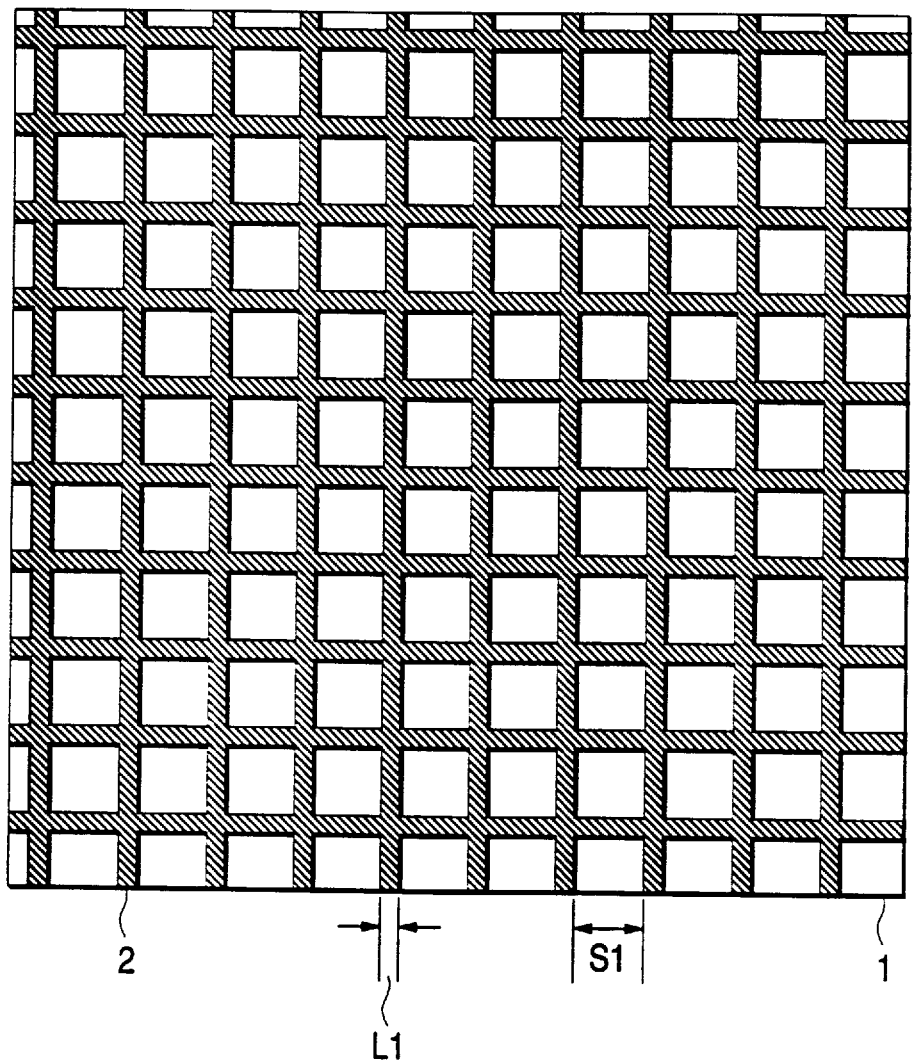
FIG. 3 is a plan view of a grid pattern in accordance with the first embodiment of the present invention.
Figure 4:
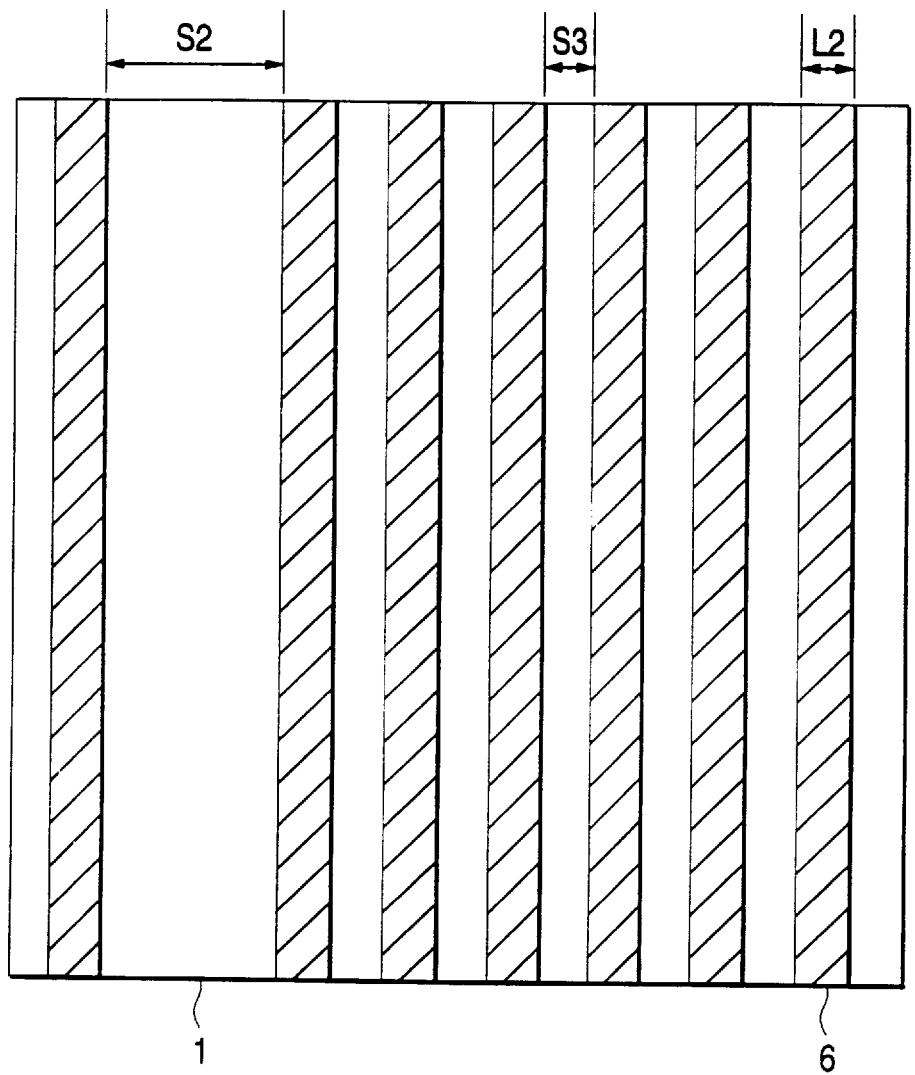
FIG. 4 is a plan view of a predetermined principal pattern in accordance with the first embodiment of the present invention.

FIG. 1 is a plan view of a mask in accordance with a first embodiment of the present invention, and FIG. 2 is a cross-sectional structural view taken along line A–A' in the plan view of the mask shown in FIG. 1. FIG. 3 is a plan view of a grid pattern formed on a mask substrate, and FIG. 4 is a plan view of a predetermined principal pattern which is formed on the mask substrate and is to be ultimately formed on the wafer.

In FIGS. 1 to 4, reference numeral 1 denotes a mask substrate which is a transparent glass substrate made of quartz glass or the like; numeral 2 denotes a grid pattern serving as an auxiliary pattern; numeral 5 denotes an insulating film formed of an oxide film such as a spin on glass (SOG) or silicon oxide film; numeral 6 denotes a predetermined principal pattern which is to be formed on the wafer; and 14 denotes a mask.

Referring to the mask 14 shown in FIGS. 1 and 2, the grid pattern 2 is formed of, for example, a Cr film or a MoSi film, and is written on the entire surface of the mask substrate 1 with a pattern line width L1 of 0.1 $\mu$m, a pattern interval width S1 of 0.40 $\mu$m, and a pitch of 0.5 $\mu$m. This grid pattern 2 is embedded in the insulating film 5 formed on the entire surface of the mask substrate. On this insulating film 5, the predetermined principal pattern 6 is formed of, for example, a Cr film or a MoSi film, and is formed on the mask substrate 1 via the insulating film 5 with a pattern line width L2 of 0.30 µm, and pattern interval widths S2 of 1.0 µm and S3 of 0.30 µm.

In the first embodiment of the present invention, the configuration of the mask is characterized in that, as shown in the mask 14, the grid pattern 2 with a line width which is not resolved on the wafer is formed in a region of the predetermined principal pattern 6 having a large pattern interval such as the pattern interval width S2, thereby providing the isolated principal pattern with cyclicity.

Figure 5A:
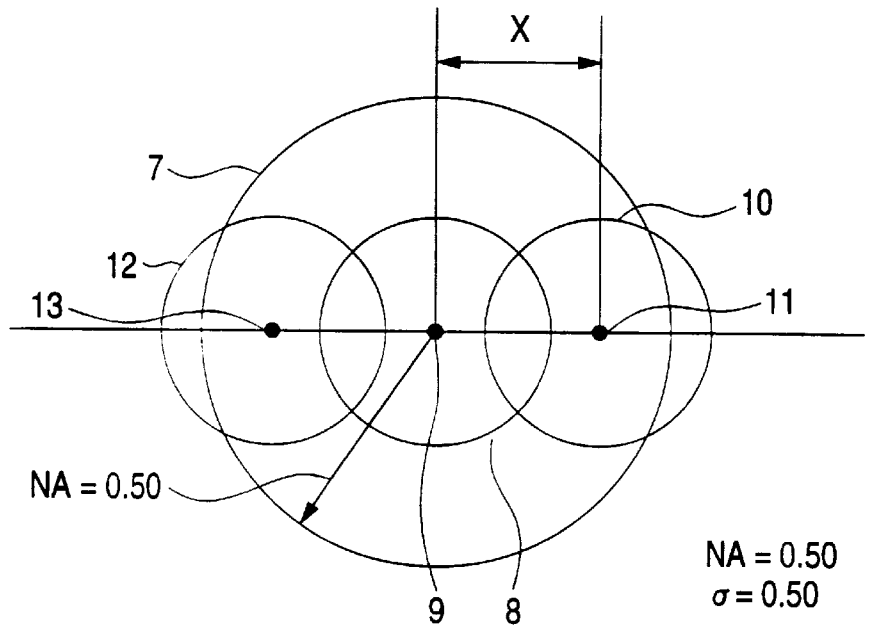
Figure 5B:
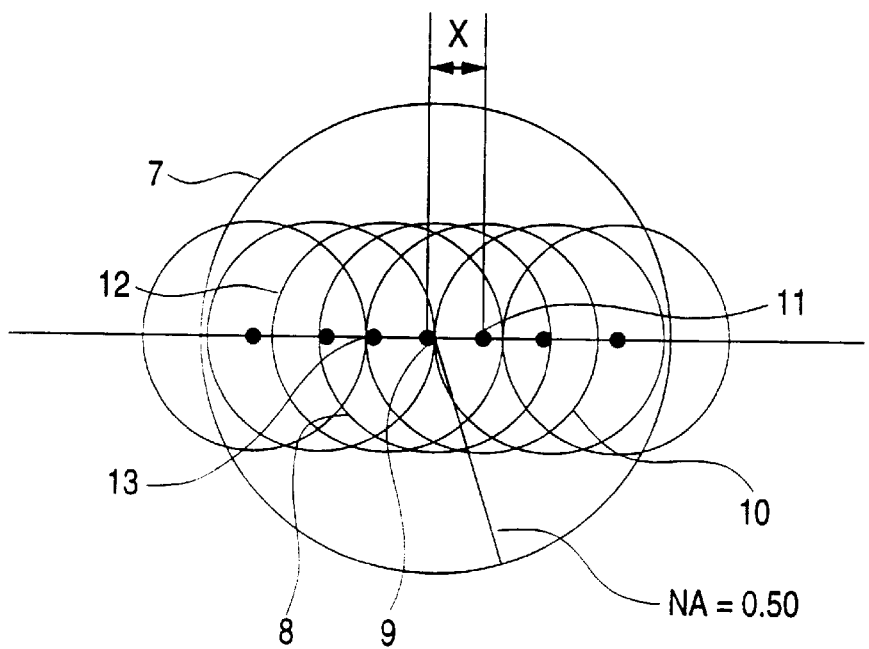

FIGS. 5A and 5B are schematic diagrams for explaining an optical image of the predetermined principal pattern 6 which is formed in the pupil's plane of a projection lens system in accordance with the first embodiment of the present invention. Specifically, FIG. 5A is a schematic diagram of a continuous pattern which is formed in the pupil's plane with a pattern line width L2 of 0.30 µm and a pattern interval width S3 of 0.30 µm. FIG. 5B is a schematic diagram of an isolated pattern which is formed in the pupil's plane with a pattern line width L2 of 0.30 µm and a pattern interval width S2 of 1.0 µm. In FIGS. 5A and 5B, a description is given of a case where a grid pattern, i.e., the auxiliary pattern, is not formed.

In FIGS. 5A and 5B, reference numeral 7 denotes the pupil's plane of the projection lens system; 8, 0th-order diffracted light formed in the pupil's plane 7; 9, a central point of the 0th-order diffracted light; 10, 1st-order diffracted light formed on the pupil's plane 7; 11, a central point of the 1st-order diffracted light; 12, −1st-order diffracted light formed in the pupil's plane; and 13, a central point of the −1st-order diffracted light.

In general, a position X of diffracted light which is generated by a pattern can be represented by $$X = \lambda/P$$

where $\lambda$ is the wavelength of exposing light, and P is the pattern pitch.

In FIG. 5A, if KrF excimer laser light is used as the exposing light, with respect to the above-described continuous pattern (L2=0.30 µm, S3=0.30 µm), the interval X from the central point 9 of the 0th-order diffracted light 8 formed in the pupil's plane 7 of the projection lens system to each of the central point 11 of the +1st-order diffracted light and the central point 13 of the −1st-order diffracted light, which are formed respectively on the left—and the right-hand sides thereof, is such that X=0.41 µm. Meanwhile, in FIG. 5B, if KrF excimer laser light is used as the exposing light, X for the aforementioned isolated pattern (L2=0.30 µm, S2=1.0 µm) is such that X=0.19 µm.

In the case of the continuous pattern in FIG. 5A, since the interval X of the diffracted light is large, higher-order diffracted light does not occur in the pupil's plane. In the case of FIG. 5B, however, since the interval X of the diffracted light is small, for instance, even ±2nd-order diffracted light and ±3rd-order diffracted light, which is higher-order diffracted light, falls on the pupil's plane. Nevertheless, if a case is considered in which the grid pattern 2 in the first embodiment of the present invention is used, since the pattern interval width S1 of the grid pattern 2 is 0.4 µm, diffracted light similar to that in FIG. 5A in the case of a dense pattern occurs, so that the depth of focus increases.

Figure 6:
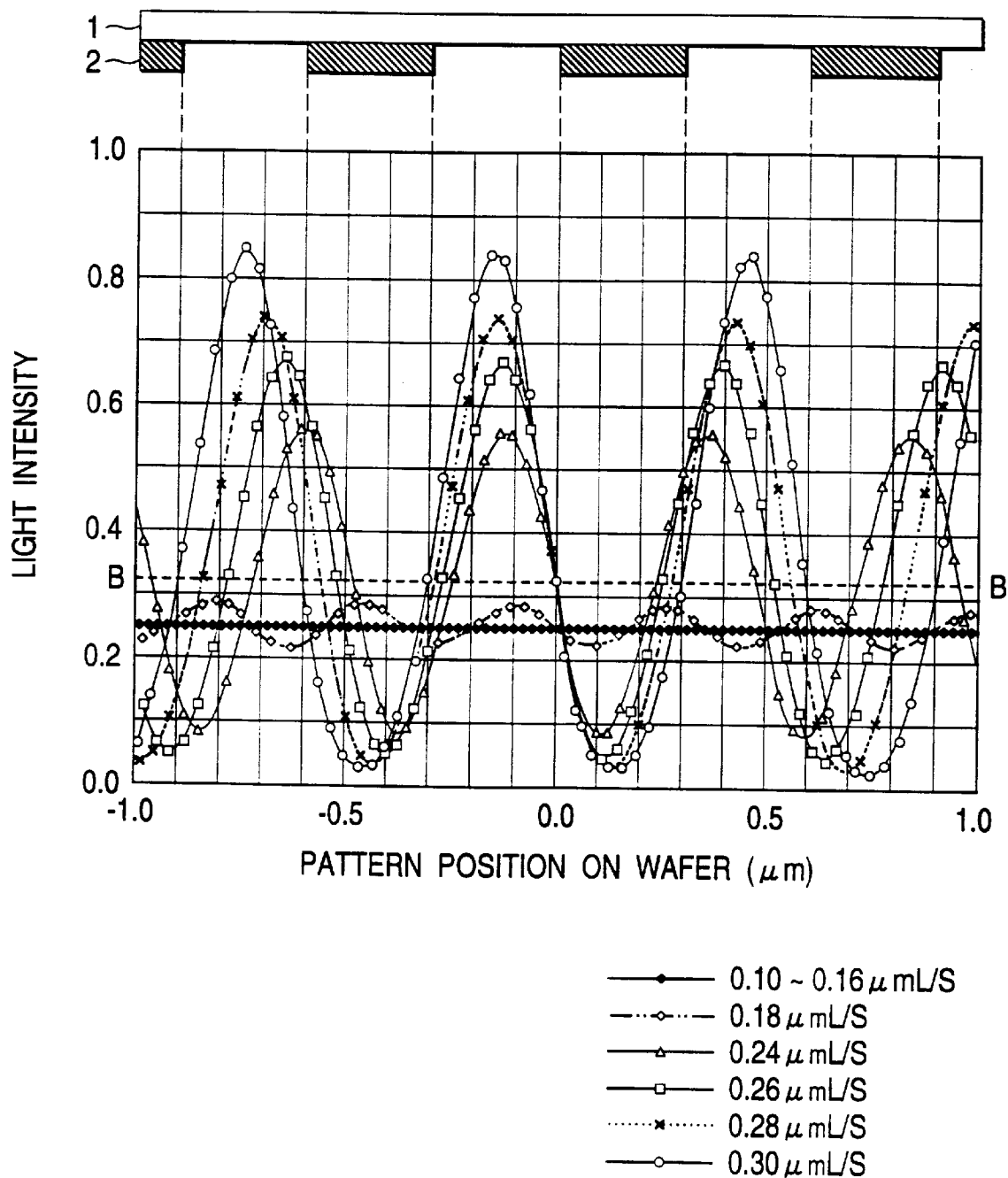
FIG. 6 is a graph illustrating distributions of the intensity of light through various line-and-space patterns in accordance with the first embodiment of the present invention.

FIG. 6 is a graph illustrating distributions on the wafer of the intensity of light through various line-and-space (hereafter abbreviated as L/S) patterns in accordance with the first embodiment of the present invention. In the first embodiment of the present invention, an important point in determining the size of the grid pattern is that the grid pattern should not be resolved on the wafer.

Therefore, referring to FIG. 6, a description will be given of the line width of the grid pattern 2 in accordance with the first embodiment of the present invention. In terms of the optical conditions, the KrF excimer laser light was used as the exposing light, the wavelength $\lambda$ was set to 0.248 µm, the numerical aperture NA of the lens was set to 0.50, and a σ value was set to 0.5. Here, the a value is a ratio between the numerical aperture of a reticle illuminating system and the numerical aperture of a projection optical lens.

In FIG. 6, the ordinate of the graph represents the intensity of light of the optical image on the wafer, while the abscissa represents the position of the pattern on the wafer. The cross-sectional view of a mask illustrated in the graph of FIG. 6 explains the intensity of light on the wafer in a case where exposure was effected using a mask having the grid pattern 2 with, for instance, 0.30 µm L/S formed on the mask substrate 1.

Referring to FIG. 6, in the cross-sectional view of the mask in the graph, the intensity of the light having a light intensity distribution of 0.30 µm L/S was weak at positions where the grid pattern 2 was present, whereas the intensity of the light having the light intensity distribution of 0.30 µm L/S was large in space portions where the grid pattern 2 was not present. The pattern which exhibits such a large difference in light intensity is capable of obtaining a high resolution. Here, the phrase 0.30 µm L/S means an L/S pattern in which the grid pattern 2 having a pattern line width of 0.30 µm is formed with a pattern interval width of 0.30 µm.

Referring to the graph of FIG. 6, when an L/S pattern having 0.10 to 0.16 µm scale was used as the grid pattern, since light was not sufficiently incident upon the pupil's plane of the projection lens, the intensity of light on the wafer was small and its level was outside a resolution limit for a photoresist on the wafer, so that the pattern was not resolved. In addition, in the case of a 0.18 µm L/S pattern, since the contrast of an image for patterning the photoresist on the wafer was insufficient, the pattern was not resolved.

The dotted line B—B shown in FIG. 6 indicates the level of the intensity of the light resolved on the wafer. It is apparent from the foregoing that if the pattern line width does not exceed the B—B line, the pattern can serve as a grid pattern for the mask in accordance with the first embodiment of the present invention. More preferably, if the line width is 0.16 µm or less, the pattern can serve as an auxiliary pattern which is not resolved on the wafer. In addition, with respect to a continuous pattern having a depth of focus, since the intensity of light at the grid line is sufficiently weak, no influence is exerted on such a continuous line.

Figure 7:
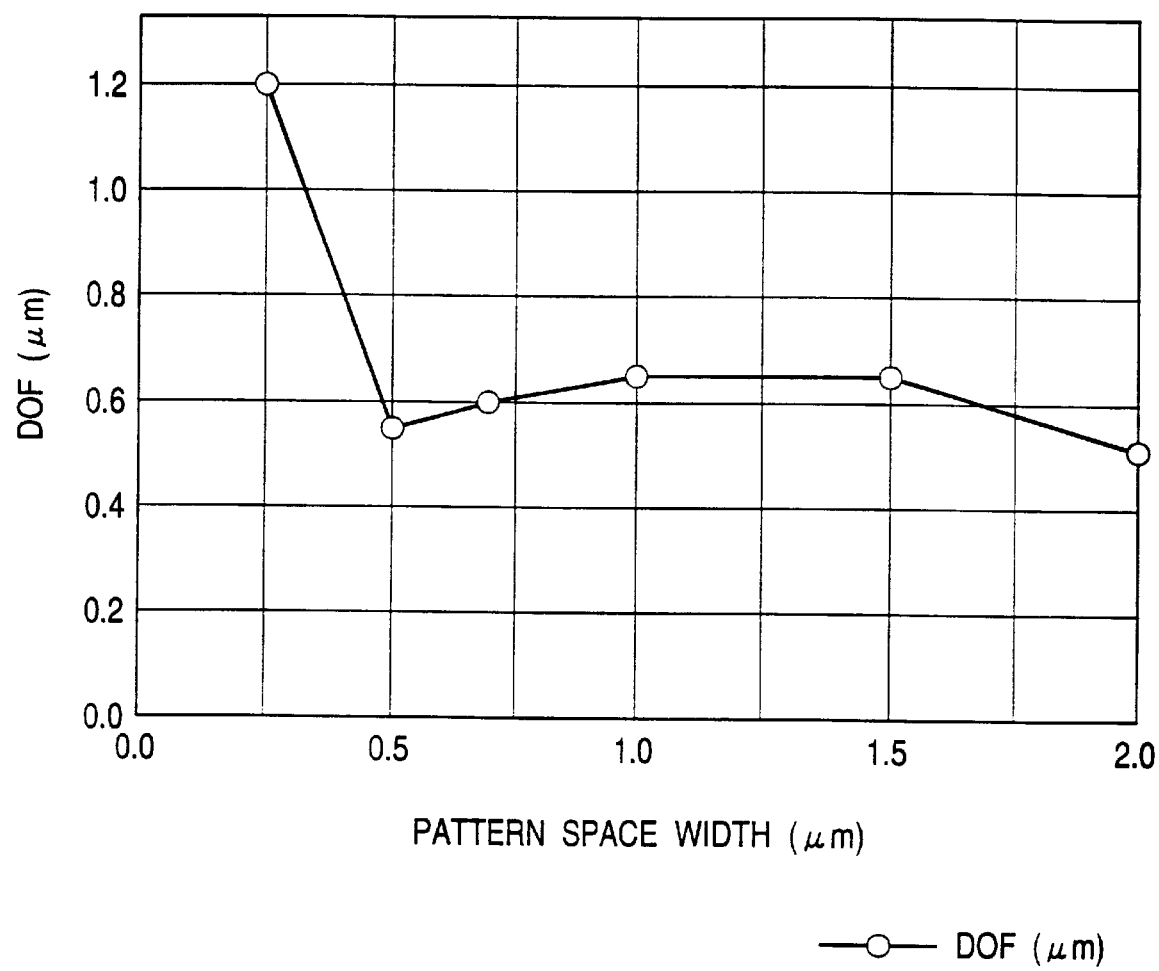
FIG. 7 is a graph illustrating the depth of focus (DOF) in a case where a fixed pattern with a pattern line width of 0.25 $\mu$m was used and the pattern interval width was taken as a parameter.

FIG. 7 is a graph illustrating the results of the depth of focus (hereafter abbreviated as DOF) in a case where a fixed pattern with a pattern line width of 0.25 µm was used and the pattern interval width was taken as a parameter. In FIG. 7, the ordinate represents DOF, and the abscissa represents the pattern interval width. Generally, the depth of focus DOF is small in the case of an isolated pattern, while DOF is large in the case of a continuous pattern.

Here, a description will be given of how densely the pattern should be formed in terms of the pitch of the grid pattern. As the optical conditions, a case is shown in which NA was set to 0.55, σ was set to 0.8, and the KrF excimer laser was used as exposing light. Although these optical conditions differ from those used at the time of determination of the grid pattern size, the optical conditions are considered to be substantially similar qualitatively. Hence, the pattern interval width of the grid pattern will be examined hereafter with reference to FIG. 7.

Referring to FIG. 7, DOF becomes small if the pattern interval width is 0.5 µm or more, while DOF becomes large if the pattern interval width is less than 0.5 µm. Namely, if the pattern has a pattern line width of 0.25 µm, the pattern pitch needs to be set to 0.75 µm or less. If the pitch of the grid pattern is determined by taking the above into consideration, since DOF is small at the 0.5 µm pattern interval width, it is necessary to provide at least one line of the grid pattern in the 0.5 µm pattern interval width. Therefore, if the line width of the grid pattern is 0.10 µm, a grid pattern having a pattern interval width of 0.40 µm or less is required.

Figure 8:
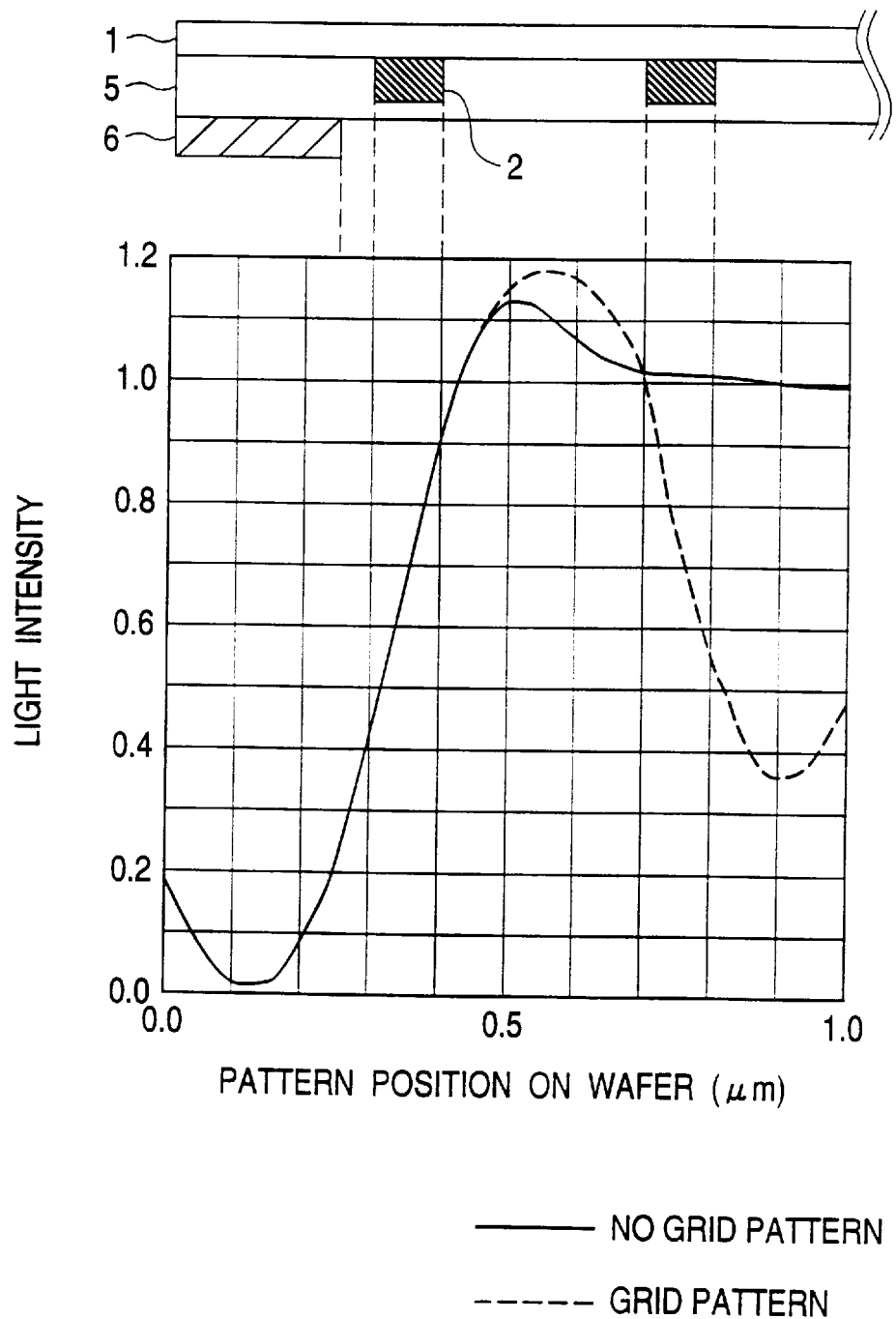
FIG. 8 is a graph illustrating optical-image evaluation of masks which were actually fabricated in accordance with the first embodiment of the present invention.

FIGS. 8 and 9 are graphs on optical-image evaluation of masks which were actually fabricated. As the optical conditions, NA was set to 0.55, and s was set to 0.5. In FIGS. 8 and 9, the ordinate represents the intensity of light of the optical image, while the abscissa represents the position of the pattern on the wafer.

FIG. 8 shows the case of optical images in a case where the grid pattern with a focus (F)=0 µm was present and in a case where it was not, by using masks in which formed on the mask substrate 1 were the predetermined principal pattern 6, i.e., an isolated pattern having a pattern line width of 0.25 µm and a pattern interval width of 2.0 µm, as well as the grid pattern 2, i.e., an auxiliary pattern having a pattern line width of 0.10 µm and a pattern interval width of 0.30 µm. Here, F=0 µm shows the position where the wafer surface is positioned at an optical image-forming point, and shows the position of best focus.

In FIG. 8, in the case of the optical image without the grid pattern, the light intensity became strong starting from an edge of the predetermined principal pattern 6 having a pattern line width of 0.25 µm, and the state of high light intensity continued over a pattern interval of 2.0 µm at an end of which an ensuing edge of the predetermined principal pattern 6 was present (not shown). In contrast, in the case of the optical image with the grid pattern, since the grid pattern 2 having a pattern line width of 0.10 µm and a pattern interval width of 0.30 µm was present in the 2.0 µm pattern interval of the predetermined principal pattern 6, the distance from one edge of the pattern to another was short, so that the optical image exhibited an excellent light intensity distribution.

FIG. 9 shows the case of optical images in a case where the grid pattern with the focus (F)=0.6 µm was present and in a case where it was not present, by using masks similar to those used in FIG. 8. Here, F=0.6 µm means that the plane of projection is offset by 0.6 µm from the position of best focus.

In FIG. 9 as well, the light intensity distribution in the case where the grid pattern was provided was excellent. It is apparent from the foregoing that even if the plane of projection is offset by 0.6 µm from the position of best focus, the grid pattern 2 produces the effect of increasing the depth of focus of the isolated pattern.

Referring next to FIGS. 10A to 10G, a description will be given of a method of fabricating the mask 14 shown in FIGS. 1 and 2. FIGS. 10A to 10G are cross-sectional structural diagrams illustrating the steps of fabrication of the mask. The cross sections are taken along A–A' in FIG. 1, for example.

Figure 10A:
FIGS. 10A to 10G are cross-sectional structural diagrams illustrating the steps of fabrication of the mask in accordance with the first embodiment of the present invention.
Figure 10B:
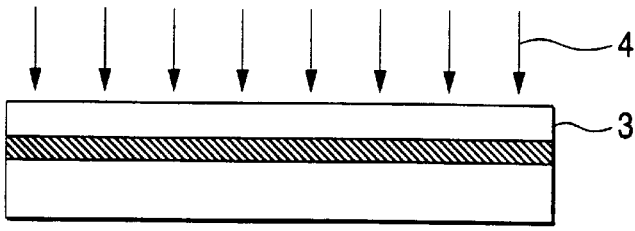
Figure 10C:
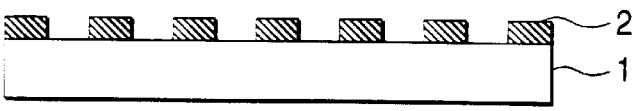

First, in FIG. 10A, a light-shielding film for constituting the grid pattern 2 is formed on the mask substrate 1 by an MoSi film or a Cr film to a film thickness of about 1000 Å. Then, in FIG. 10B, a photoresist 3 for an electron beam is coated on the light-shielding film, and a mask pattern is delineated on the resist 3 by delineation using an electron beam 4. Subsequently, in FIG. 10C, dry etching, for example, is effected to form the grid pattern 2. In dry etching, $CCl_4+O_2$ gas, for instance, is used for the Cr film, while $CF_4+O_2$ gas, for instance, is used for the MoSi film.

Figure 10D:
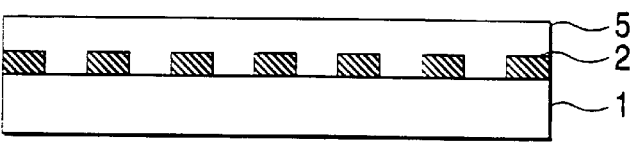
Figure 10E:
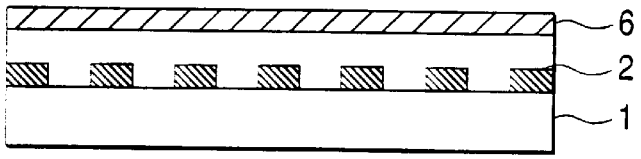
Figure 10F:
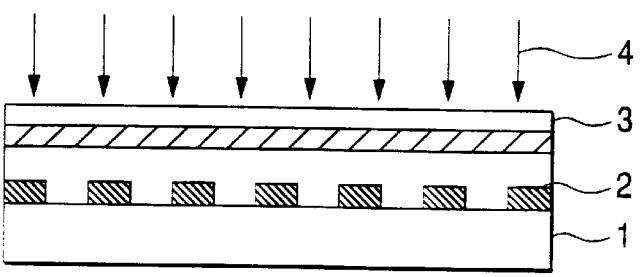
Figure 10G:
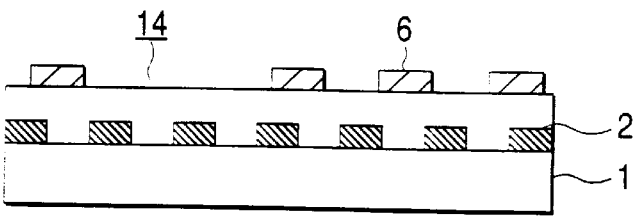

Next, in FIG. 10D, the insulating film 5 formed of SOG or the like is coated on the mask surface to a film thickness of about 2000 Å as a stopper film for etching. Then, in FIG. 10E, a light-shielding film for constituting the predetermined principal pattern 6, which pattern is to be formed on the wafer, is formed by the MoSi film or the Cr film with a film thickness of about 1000 Å. Next, in FIG. 10F, the resist 3 for the electron beam is coated on the light-shielding film, and a mask pattern is delineated on the resist 3 by delineation using the electron beam 4. Subsequently, in FIG. 10G, the principal pattern 6 is formed by effecting dry etching, for example.

As described above, in the method of fabricating the mask in accordance with the first embodiment of the present invention, since the grid pattern 2, i.e., an auxiliary pattern, is formed prior to the formation of the predetermined principal pattern 6, an advantage can be obtained in that the fabrication of the mask can be effected simply without needing to pay heed to the position of the auxiliary pattern corresponding to an isolated pattern portion of the predetermined principal pattern 6.

By using the mask 14 fabricated in the above-described manner, reduction projection exposure is effected using, for example, KrF excimer laser light as exposing light, and the predetermined principal pattern 6 to be formed is transferred onto the resist on the wafer surface which constitutes the plane of projection. Subsequently, the wafer is developed to form the predetermined principal pattern 6 on the wafer. Thereafter, as for the remaining steps subsequent to the steps of lithography, semiconductor devices are manufactured in accordance with known manufacturing steps.

By effecting lithography using the mask 14, the depth of focus can be increased by the auxiliary pattern with respect to not only a continuous pattern but also an isolated pattern having a small depth of focus. Therefore, the depth of focus of the patterns of the entire mask can be increased, and it is possible to form satisfactory patterns without causing a blurring of the image due to exposure or a decline in the resolution even if exposure is effected with respect to an actual wafer surface where a warping or surface irregularities are present. Hence, it is possible to obtain highly integrated semiconductor devices excelling in electric characteristics.

Further, since the auxiliary pattern for increasing the depth of focus of the isolated pattern has a line width which is not revolved on the wafer, a mask for removing the auxiliary pattern and a step for fabricating the mask are not required. Thus there is an advantage in that the process of manufacturing semiconductor devices can be simplified.

Second Embodiment

In the first embodiment of the present invention, the insulating film 5 formed of such as SOG is provided between the light-shielding film for constituting the grid pattern 2 and the light-shielding film for constituting the predetermined principal pattern 6 to be formed on the wafer. In a second embodiment, materials having selective reactivities to etching are used as the material of the light-shielding film for forming the grid pattern 2 and the material of the light-shielding film for forming the predetermined principal pattern 6 to be formed on the wafer, so as to allow the mask to be fabricated without forming the insulating film 5 between the grid pattern 2 and the predetermined principal pattern 6. For example, if the light-shielding film in the first layer is formed of the Cr film, and the light-shielding film in the second layer is formed of the MoSi film, since an etching selectivity ratio is present between the two light-shielding films, the insulating film 5 becomes unnecessary. Hence, there is an advantage in that the mask fabrication process can be simplified.

Third Embodiment

Figure 11:
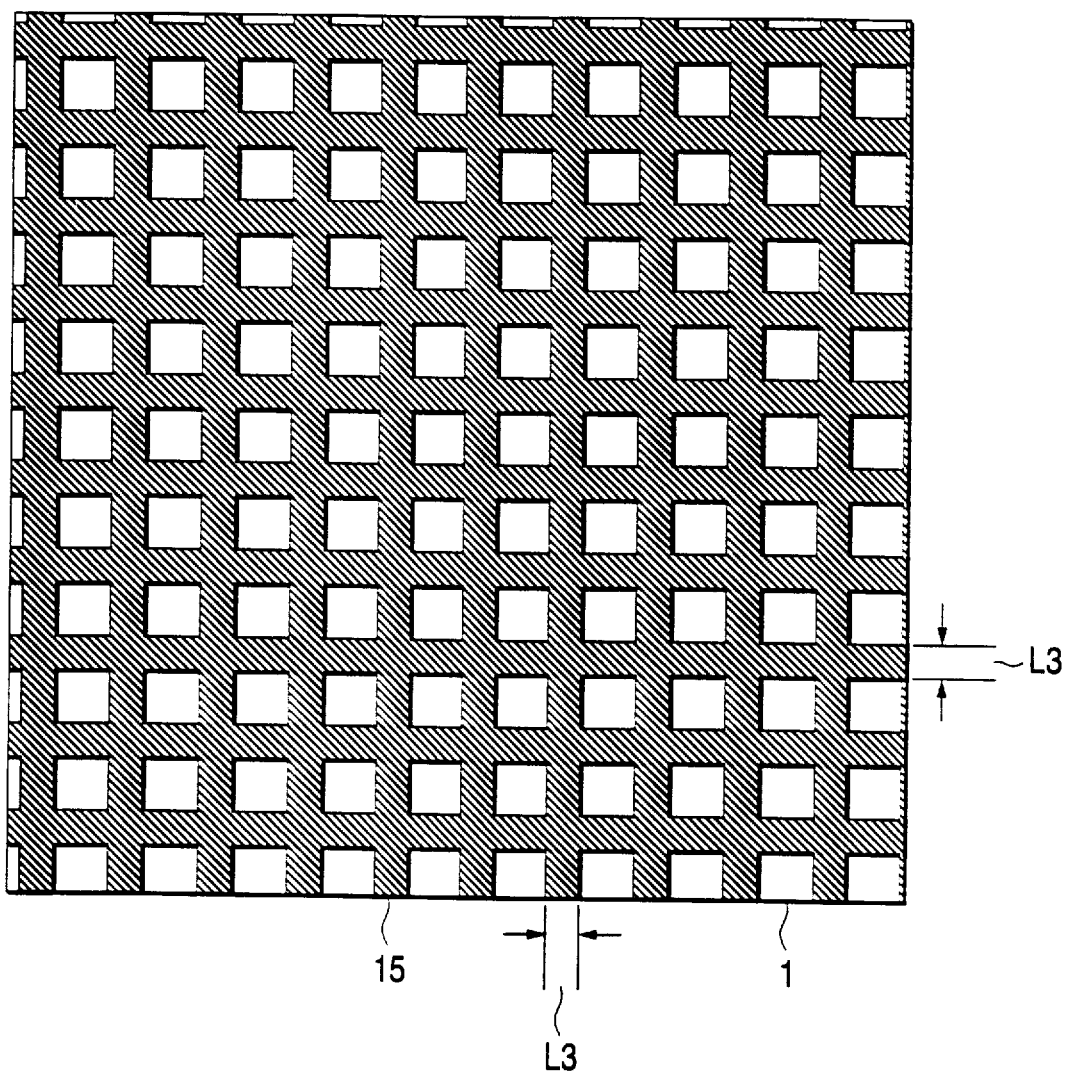
FIG. 11 is a plan view of a grid pattern in accordance with a third embodiment of the present invention.
Figure 12A:
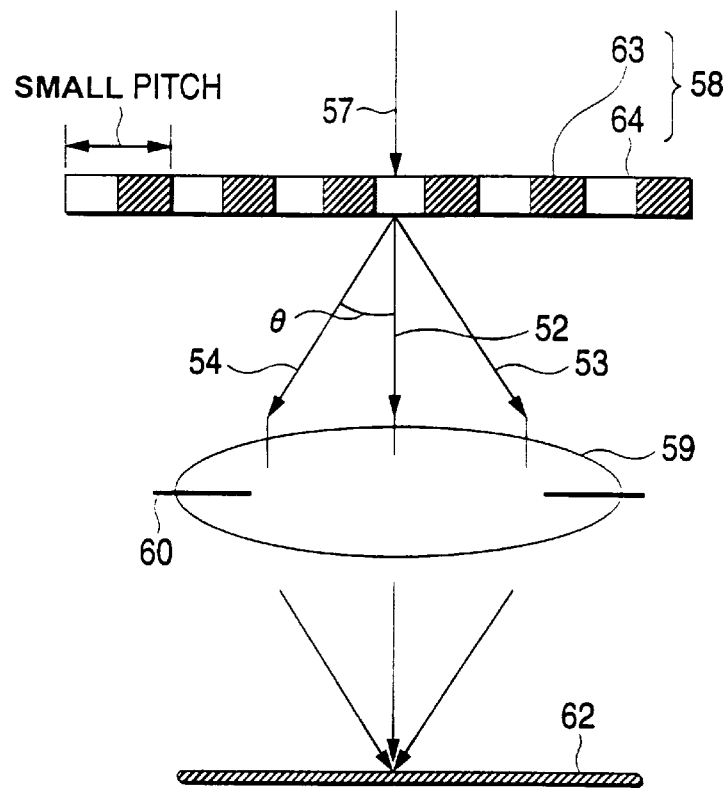
Figure 12B:
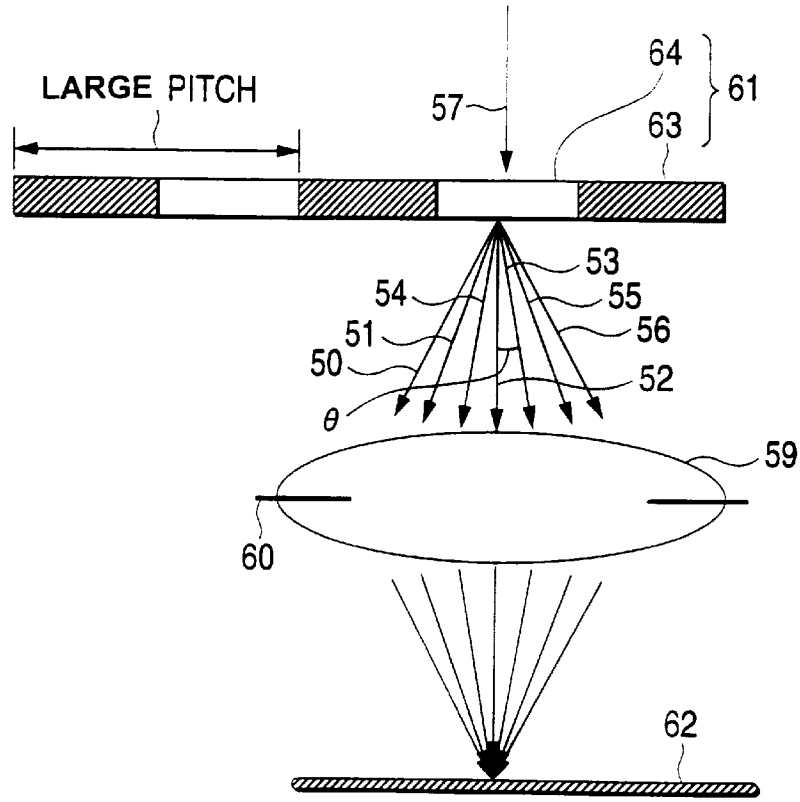
Figure 13A:
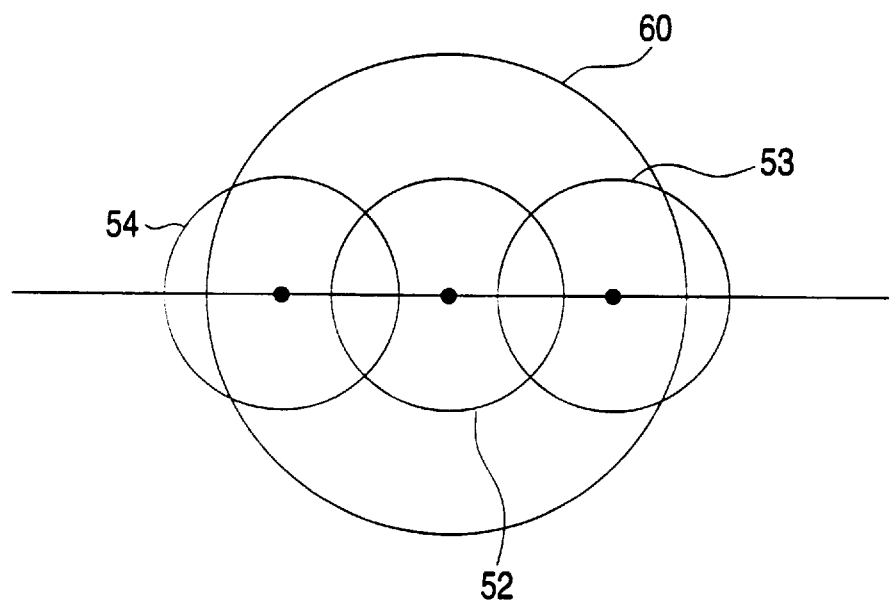
Figure 13B:
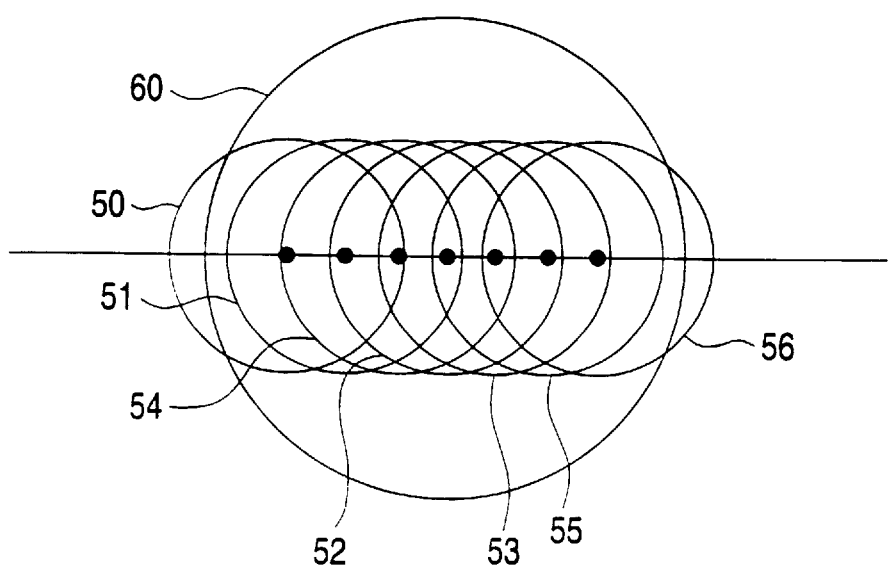
Figure 14A:
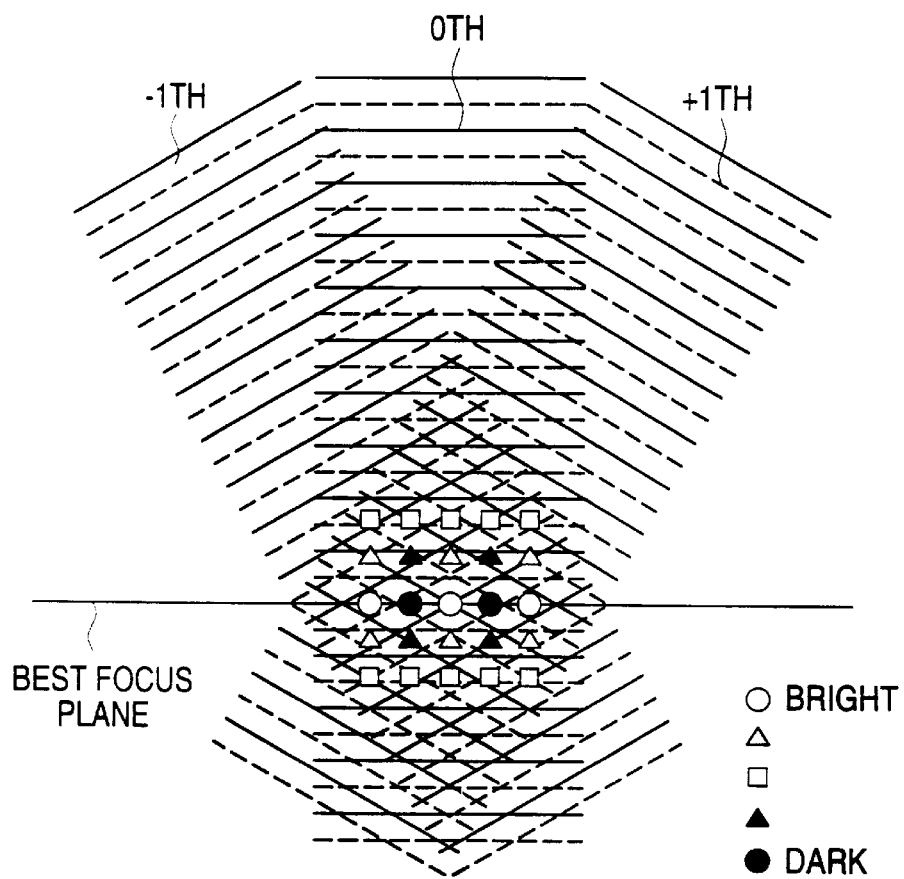
Figure 14B:
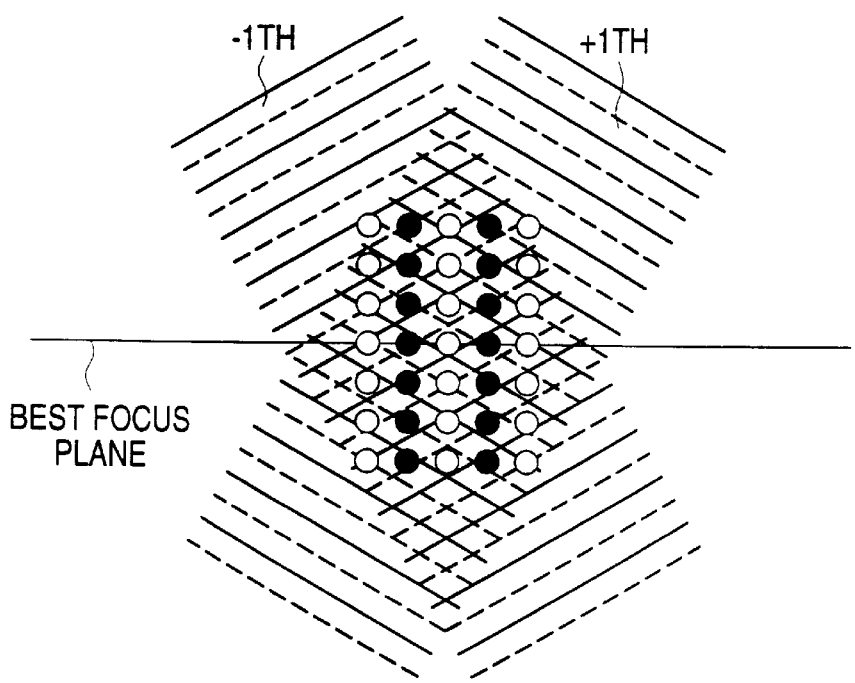
Figure 15A:
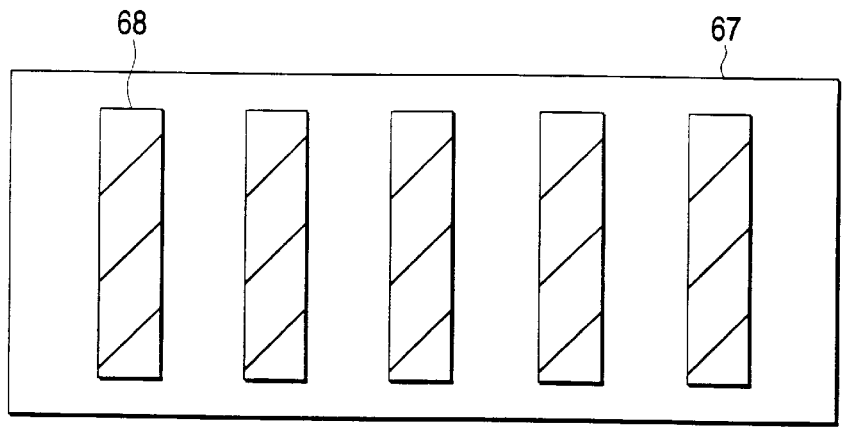
Figure 15B:
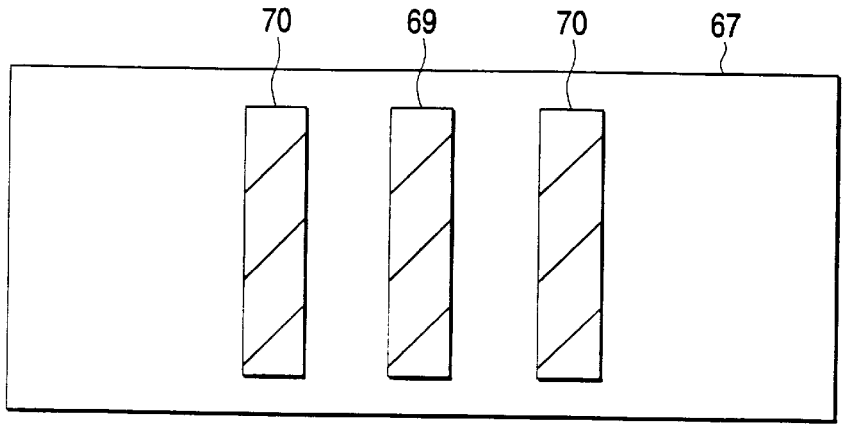
Figure 15C:
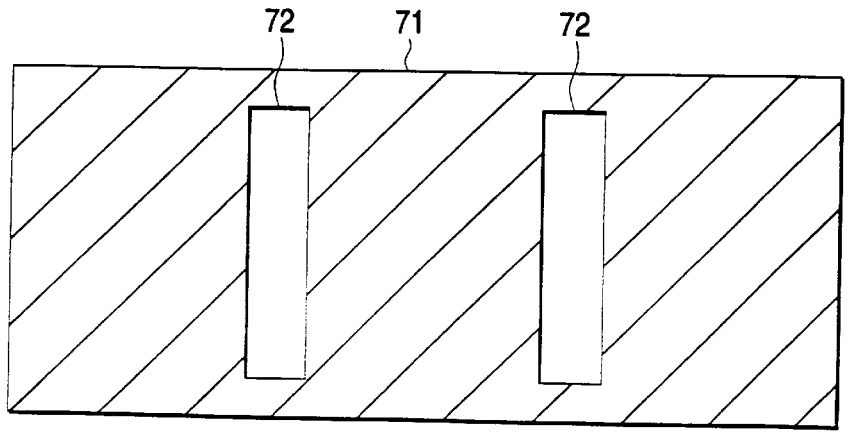

FIG. 11 is a plan view of a grid pattern, i.e., the auxiliary pattern, in accordance with a third embodiment of the present invention. In the third embodiment of the invention, the light-shielding film for forming the grid pattern is formed of a halftone film 15. As the grid pattern, it is necessary to form a pattern having a line width which falls outside a resolution limit for a resist on the wafer. Therefore, if a completely shielding film were used, the line width of the grid pattern would become equivalent to or less than 0.10 $\mu$m or thereabouts. However, if the grid pattern is formed of the halftone film 15, such as an MOSiON film or a CrON film, having a transmittance T of 30% or more, the pattern line width is allowed up to a vicinity of 0.14 $\mu$m. Hence, there is an advantage in that the fabrication of the mask is facilitated.

In addition, the method of fabrication of the mask in the third embodiment is similar to the fabrication method in the first embodiment.

Although, in the first to third embodiments, the light-shielding film for forming the grid pattern 2 is first formed on the substrate, and the predetermined principal pattern 6 to be formed on the wafer is subsequently formed, the order of the steps may be reversed. Further, although, in the first to third embodiments, the grid pattern 2 is formed at equal intervals, the grid pattern 2 may not be formed at equal intervals insofar as the grid pattern 2 is arranged within the pitch. Moreover, the grid pattern 2 may not be formed on the entire surface of the mask, and it suffices if the grid pattern 2 is present only at the portion of the isolated pattern.

Still further, the auxiliary patterns in the first to third embodiments may not be grid patterns, and may be stripe patterns which are line-and-space patterns oriented in the direction in which the isolated pattern is arranged.

What is claimed is:

1. An exposure mask comprising:
   a mask substrate;
   a predetermined principal pattern formed on a principal surface of said mask substrate, said predetermined principal pattern to be transferred to a semiconductor substrate;
   a cyclic auxiliary pattern having a line width which falls outside a limit of resolution on a plane of projection of exposing light and which cyclic auxiliary pattern is not resolved to the semiconductor substrate.

2. The exposure mask as claimed in claim 1, wherein said predetermined principal pattern includes a continuous pattern of lines which are repeatedly arranged at a first interval and an isolated pattern which is arranged adjacent to a line of the continuous pattern at a second interval greater than the first interval; and
   said cyclic auxiliary pattern is formed along a direction in which the predetermined principal pattern is arranged, adapted to overcome multiple-beam-flux interference of diffracted light on a pupil's plane.

3. The exposure mask as claimed in claim 1, wherein said auxiliary pattern is formed only at a portion corresponding to said isolated pattern.

4. The exposure mask as claimed in claim 1, wherein the auxiliary pattern is a grid-shaped pattern.

5. The exposure mask as claimed in claim 1, wherein the auxiliary pattern is formed of a halftone-type material.

6. A method of fabricating an exposure mask, comprising the steps of:
   forming on a mask substrate an auxiliary cyclic pattern having a line width which falls outside a limit of resolution on a plane of projection of exposing light and which is not resolved to a semiconductor substrate;
   forming an insulating film on the auxiliary cyclic pattern; and
   forming a predetermined principal pattern in which a continuous pattern of lines which are repeatedly arranged at a first interval and an isolated pattern which is arranged adjacent to a line of the continuous pattern at a second interval greater than the first interval are arrayed on the insulating film,
   wherein the auxiliary cyclic pattern formed in the step of forming the auxiliary pattern overcomes multiple-beam-flux interference of diffracted light on a pupil's plane.

7. A method of manufacturing a semiconductor device, comprising the step of:
   effecting reduction projection exposure by using a mask including:
   a predetermined principal pattern formed on a principal surface of a mask substrate, said predetermined principal pattern to be transferred to a semiconductor substrate as a circuit pattern;
   a cyclic auxiliary pattern having a line width which falls outside a limit of resolution on a plane of projection of exposing light and which cyclic auxiliary pattern is not resolved to the semiconductor substrate.

8. The method of manufacturing a semiconductor device as claimed in claim 7, wherein said predetermined principal pattern includes a continuous pattern of lines which are repeatedly arranged at a first interval and an isolated pattern which is arranged adjacent to a line of the continuous pattern at a second interval greater than the first interval; and
   said cyclic auxiliary pattern is formed along a direction in which the predetermined principal pattern is arranged, adapted to overcome multiple-beam-flux interference of diffracted light on a pupil's plane.

* * * * *